United States Patent [19]
Abajian

[11] 4,216,445
[45] Aug. 5, 1980

[54] VARIABLE RESISTANCE ATTENUATOR

[75] Inventor: Anthony Abajian, Ronkonkoma, N.Y.

[73] Assignee: The United States of America as represented by the Secretary of the Army, Washington, D.C.

[21] Appl. No.: 972,199

[22] Filed: Dec. 22, 1978

[51] Int. Cl.² ............................................. H01P 1/22
[52] U.S. Cl. .................... 333/81 R; 333/109
[58] Field of Search ............... 333/109, 115, 116, 164, 333/81 R, 81 A

[56] References Cited

U.S. PATENT DOCUMENTS

| | | | |
|---|---|---|---|
| 3,202,942 | 8/1965 | Garver et al. | 333/81 R X |
| 3,443,249 | 5/1969 | Ashley | 333/109 X |
| 3,673,492 | 6/1972 | Gilson | 333/81 A X |
| 3,943,467 | 3/1976 | Yamada et al. | 333/116 X |

*Primary Examiner*—Paul L. Gensler
*Attorney, Agent, or Firm*—Nathan Edelberg; Sheldon Kanars; Bernard Franz

[57] ABSTRACT

Four PIN diodes are connected, two in parallel oppositely directed at each of two ports of a 3 dB, quadrature hybrid which equally divide the power from an input port. The mismatch produced by the PIN diode resistance in parallel with the matching load resistance reflects part of the power, which combines at the two ports and exits at a fourth port of the hybrid. Direct-current bias to the PIN diodes is adjusted to vary the attenuation. There is also variable resistance and capacitance which serves as variable adjustments on the terminations of the hybrid when the diodes are unbiased.

3 Claims, 6 Drawing Figures

ATTENUATION CHARACTERISTICS

VARIABLE RESISTANCE ATTENUATOR

BACKGROUND OF THE INVENTION

This invention relates to a variable resistance attenuator for radio frequency power, and more particularly to an attenuator using PIN diodes with adjustable direct-current bias connected to two ports of a hybrid.

Various variable resistance attenuators are known which make use of the property of PIN diodes that the RF resistance is a function of the direct-current bias. These include PI and bridged T configurations. It is also known to use two PIN diodes connected back-to-back across two ports of a 3 dB, quadrature hybrid, with adjustable DC bias. See for example Hewlett Packard Application Note 922, page 10.

There are also known modulator and mixer circuits which use four matched diodes in a bridge configuration.

SUMMARY OF THE INVENTION

An object of the invention is to provide a variable resistance attenuator having linear phase response, low insertion loss and constant attenuation over a broad range of frequencies.

A feature of the invention relates to the use of at least four PIN diodes as an attenuator coupled to radio-frequency input and output circuits via at least one quadrature hybrid, with adjustable direct-current bias of the diodes to vary the attenuation. Two diodes are in parallel, oppositely directed, from each of two ports of the hybrid, at which the power from the input port is equally divided.

Another feature relates to adjustable resistance and capacitance which serve as variable adjustments on the terminations of the quadrature hybrid. These variable elements permit the matching of the effective terminations to the characteristic impedance of the hybrid. This permits maximization of the attenuation range.

THE DRAWINGS

DETAILED DESCRIPTION

There are many situations with radio-frequency circuits in which variable attenuation is desired. One example is a steerable null antenna configuration, which uses both amplitude and phase control of the antenna current to position the null direction. If the system is used for both transmit and receive, the power handling ability is important. In designing a system including a 40 watt transmitter, there was a design objective in the receive mode of +22 dBm with +10 dBm as a minimum requirement for the attenuator, and in the transmit mode +46 dBm as a minimum requirement. The desired attenuation range was 20 dB in 40 steps of 0.5 dB each.

One prior art type of variable resistance attenuator using PIN diodes is a hybrid coupled design that achieves a constant impedance characteristic by virtue of the properties of the coupling elements which are placed between the RF ports and the PIN diodes.

Figure 1:
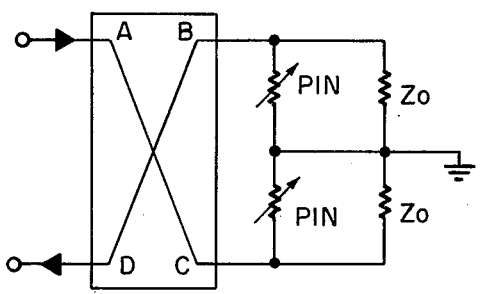
FIGS. 1 and 2 are functional block and schematic drawings of prior art attenuators using quadrature hybrids and PIN diodes.

In the circuit of FIG. 1 the power incident on Port A of a 3 dB, 90 degree hybrid divides equally between Ports B and C, and Port D is isolated. The mismatch produced by the PIN diode resistance in parallel with the load resistance at Ports B and C reflects part of the power. The reflected powers at B and C combine and exit out of Port D. Port A, in this case, is isolated and therefore appears matched to the input signal. The maximum attenuation that can be achieved with this scheme depends on the directivity of the coupler and the quality of the terminations at Ports B and C when the diodes are unbiased. The VSWR (voltage standing wave ratio) at Port A will depend on the equality of the power split in the hybrid and the equality of the reflection coefficients at Ports A and B. To assure the latter, the diodes must be reasonably well matched and must be spaced equally from Ports B and C. The insertion loss will depend on the losses and the equality of power split in the coupler and the minimum resistance of the PIN diodes when forward biased.

Figure 2:
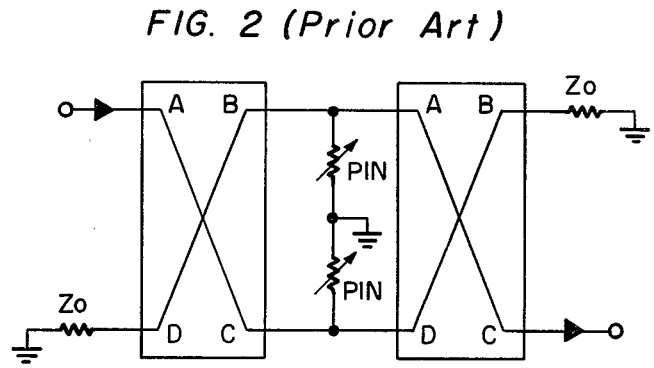

This kind of attenuator is useful over a wide frequency range. However, due to the hybrid directivity there will be a ripple in the high attenuation (20 to 25 dB range) state versus frequency. The ripple in the attenuation characteristics of the single hybrid coupled attenuator can be eliminated by using two identical hybrids as shown in FIG. 2. This circuit eliminates the dependence of attenuation on hybrid directivity and its variation with frequency.

The switching speed of the hybrid coupled devices is also limited by the coupling and PIN diode biasing networks.

Since the variable resistance type attenuators are dependent on the behavior of PIN diodes, it is worthwhile at this point to review the key properties of PIN diodes.

Figure 4:
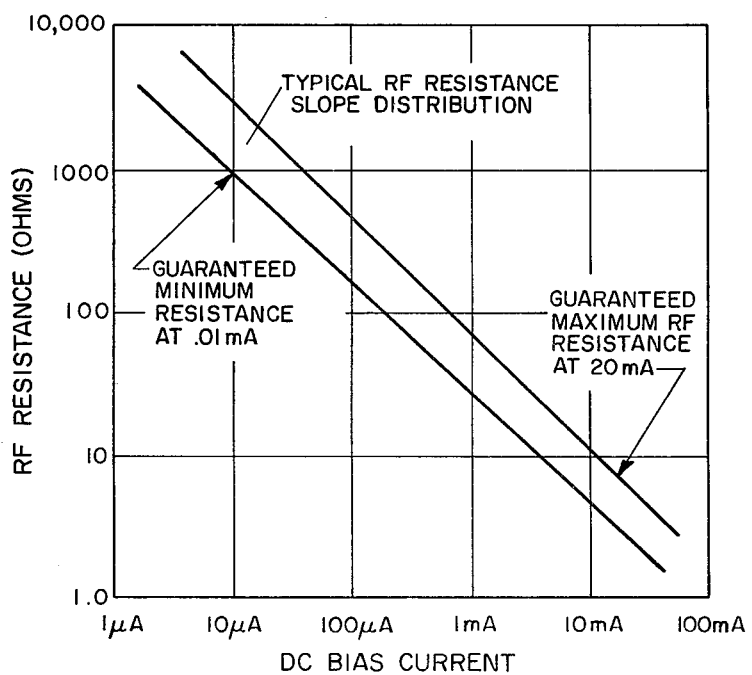
FIG. 4 is a graph of PIN diode RF resistance versus D.C. bias current.

The most important feature of the PIN diode is its inherent ability to act as a current controlled resistor at rf frequencies. Most diodes possess this capability to some degree, but the PIN diode is especially optimized in design to achieve a wide resistance range with consistently good linearity and low distortion. As typically shown in FIG. 4, when the control current is varied continuously from one microampere to 100 milliamperes, the resistance of a PIN diode will change from over ten thousand ohms to about one ohm. This characteristic variation of resistance with current makes the PIN diode ideally suited for attenuator applications.

The PIN diode is similar to ordinary PN junction diodes except for an added intrinsic region (I-layer) sandwiched between the p+ and n+ layers. It is in this I-layer that the control of minority carriers is enhanced. The resistance and large width of the intrinsic layer result in a high breakdown voltage and low capacitance. When forward bias is applied between p+ and n+ layers, the injection of minority carriers into the intrinsic region increases the conductivity of the I-layer.

Above a limiting frequency the PIN diode acts as a pure resistance. This rf resistance is controlled by varying the forward bias. Below the limiting frequency, rectification occurs as in an ordinary PN diode. In the vicinity of the limiting frequency there is some rectification with resulting distortion. The amount of distortion is dependent on the bias current, rf power, the frequency, and minority carrier lifetime. Distortion becomes appreciable at a frequency of operation equal to about 10 times the inverse of the minority carrier lifetime. Diodes of the HP 5082-3080 series, especially designed for low frequency operation, have a lifetime in excess of 1 microsecond, and are thus useful below 10 MHz.

Performance data were also evaluated for a 50 ohm pi type attenuator, a 75 ohm bridged tee attenuator circuit employing two different types of PIN diodes. These two diode types differ principally in their minority carrier lifetimes. The HP 5082-3080 has a typical effective minority carrier lifetime of 1.3 microseconds, while the HP 5082-3081 has an effective minority carrier lifetime of 2.0 microseconds. The longer lifetime HP 5082-3081 PIN diodes definitely show more favorable intermodulation characteristics than the HP 5082-3080. The PI and bridge tee configuration are very compact and are useful at low frequencies in the range of 10 MHz to 500 MHz. In addition, they exhibit little change in phase with attenuation (10 degree change in phase for a 20 dB change in attenuation) and maintain a reasonable impedance match (less than 1.4:1 VSWR). While the input/output VSWR's of the PI and tee type attenuators are good, the VSWR for the hybrid coupled type is better. For example, if ports B and C (see FIG. 1) are terminated in mismatches with voltage reflection coefficients, B and C respectively and a signal is incident on port A; then the voltage reflection coefficient at port A is given by:

$$\Gamma_A = \tfrac{1}{2}[\Gamma_B - \Gamma_C]$$

And at Port D $$\Gamma_D = \tfrac{1}{2}[\Gamma_B + \Gamma_C]$$

Thus, if port D is terminated in a matched load, the hybrid behaves like a tee with an input reflection coefficient half the difference between the reflection coefficients of the output loads. If the output reflection coefficients are equal $\Gamma_B = \Gamma_C$, then the input port is perfectly matched even for such drastic output conditions as open or short circuits.

Figure 3:
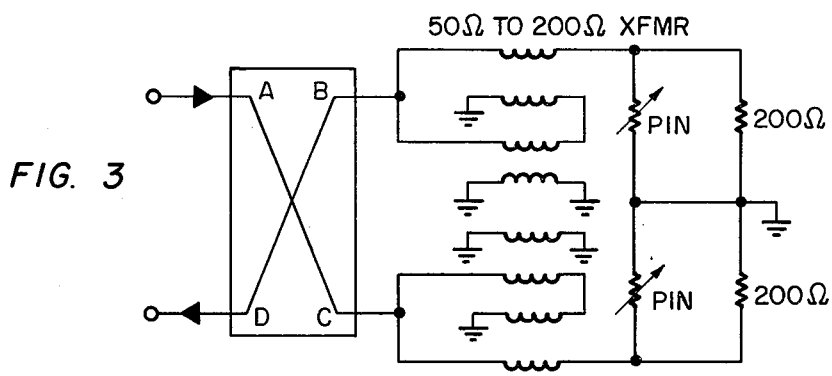
FIG. 3 is similar to FIG. 1 with an impedance transformer between the hybrid and the diodes.

It is the behavior of this type of attenuator configuration and the constraints imposed upon it by components suitable for use in the 30 MHz to 80 MHz band that was the subject of experimental evaluation. The three attenuator configurations, shown in FIGS. 1, 2 and 3 were fabricated and evaluated. Both stripline and lumped element type quadrature hybrids were employed in the breadboards. The circuit of FIG. 3 is a variation of FIG. 1 where the hybrid output impedance of 50 ohms is stepped up by means of transmission line type transformers to an impedance level of 200 ohms. The transformer may be bifilar wound on a toroid core. This configuration has the advantage of requiring less PIN diode current swing in order to achieve the same attenuation range as the circuit of FIG. 1. However, the circuit of FIG. 3 exhibited a greater change in the phase versus attenuation characteristic than the circuit of FIG. 1.

Comparison of the performance of these three configurations was facilitated by substituting pairs of matched resistors, covering the range from 1.5 ohms to 1000 ohms, as a simulation of the loading presented by the PIN diodes. Best overall performance was attained by the circuit of FIG. 1.

Figure 5:
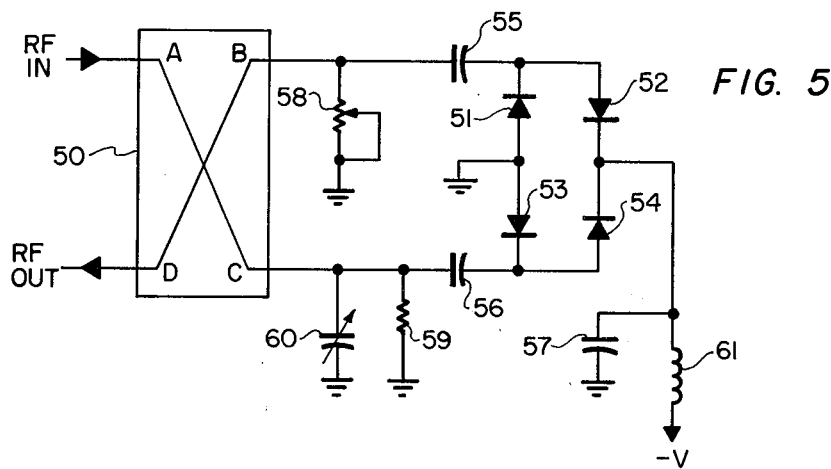
FIG. 5 is a functional block and schematic diagram of an attenuator according to the invention.

An improvement of the circuit of FIG. 1 is shown in FIG. 5. The quadrature hybrid 50 may be ANZAC type JH-115. There are four PIN diodes 51-54 which may be Hewlett-Packard type HP 5082-3080, coupled to the hybrid ports B and C via 0.1 microfarad capacitors 55 and 56. A direct current bias source $-V$ adjustable between 0 and 100 milliamperes is coupled via a radio frequency choke 61 to the cathodes of diodes 52 and 54. These cathodes are coupled to ground for AC via a 0.01 microfarad capacitor 57. The anodes of diodes 51 and 53 are connected directly to ground. Thus for bias currents diodes 51 and 52 are in series, and in a parallel path diodes 53 and 54 are in series; while for radio frequency current flow diodes 51 and 52 are in parallel from port B to ground, and diodes 53 and 54 are in parallel from port C to ground.

A 100-ohm variable resistance 58, a 2.5–11 picofarad variable capacitor 60, and a 47-ohm resistance 59 serve as variable adjustments on the terminations $Z_o$ of the quadrature hybrid 50 when the diodes are unbiased.

In any of FIGS. 1-3 the two diodes shown as resistors PIN may be replaced by the four-diodes and bias configuration of FIG. 5. Also in FIGS. 1 and 2 the fixed terminations $Z_o$ may be replaced by elements like resisstors 58 and 59 and capacitor 60, while in FIG. 3 these elements would need to have four times the impedance for the 200-ohm terminations. The discussion relating to FIGS. 1-3 applies to circuits using four diodes as shown in FIG. 5.

Figure 6:
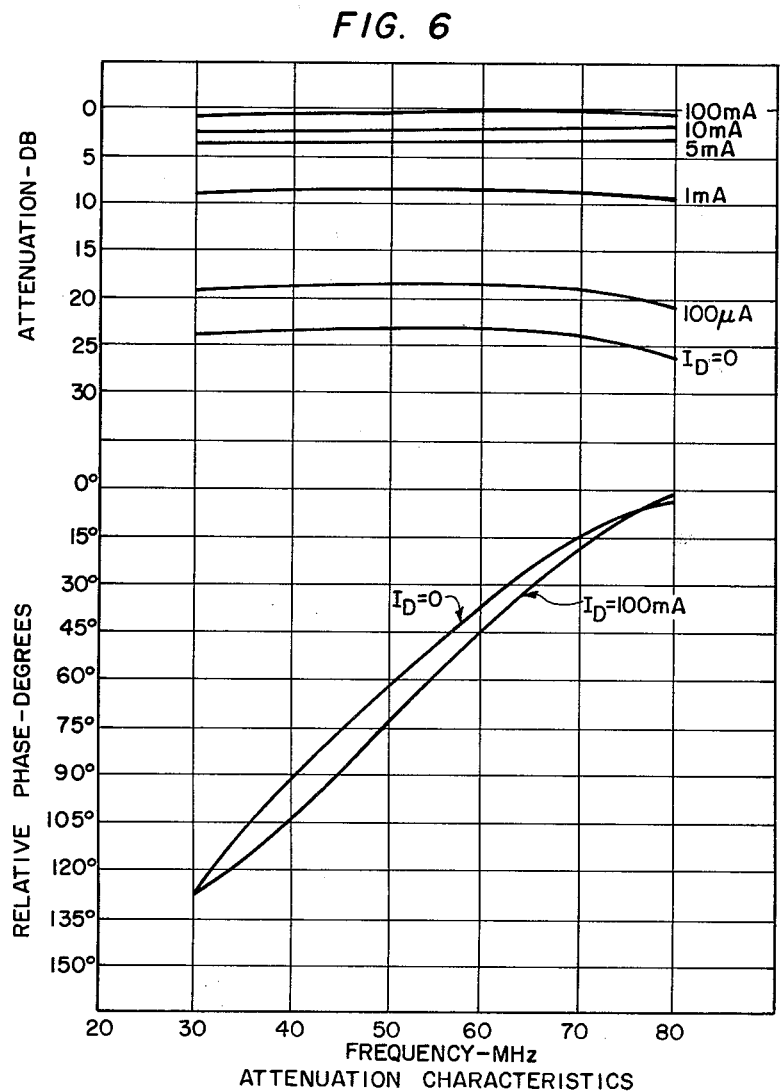
FIG. 6 comprises performance graphs for the circuit of FIG. 5.

For the circuit configuration of FIG. 5, the graphs of FIG. 6 show the attenuation characteristics as a function of diode current versus frequency, and also the transmission phase characteristics at maximum ($I_D=0$) and at minimum ($I_D=100$ ma) attenuation. This attenuator was tested at a +21 dBm signal input level. Harmonics of the input frequency (36 MHz) were detected when the diode current was set to one milliampere. At this setting, the rf input level induced a small degree of diode rectification. For diode current values less than or greater than one milliampere, no harmonics were detected.

CONCLUSION

There is disclosed an improved variable resistance attenuator using a quadrature hybrid and four PIN diodes, and having variable characteristic termination impedance. The advantage of the parallel combination of diodes to AC is that it effectively lowers the resistance presented by the PIN diodes by a factor of two. Minimization of this resistance results in a lowering of the insertion loss. The use of four diodes instead of two also permits greater power handling capability for a given amount of harmonic distortion.

The elements which serve as variable adjustments on the terminations when the diodes are unbiased permit the matching of the effective terminations to the 50-ohm characteristic impedance of the quadrature hybrid. This permits maximization of the attenuation range.

It should be understood that "ground" as used herein refers to a common reference conductor, and not necessarily an actual earth connection.

What is claimed is:

1. A variable resistance attenuator comprising:
   quadrature hybrid means having an input port, an output port, and at least first and second other ports, such that radio frequency power applied at the input port divides equally between the first and second other ports, and the output port is isolated;

at least four PIN type diodes whose radio-frequency resistance is a function of their direct-current bias coupled to said first and second other ports, with first and second of said diodes in parallel coupled between the first other port and ground, and third and fourth of said diodes in parallel between the second other port and ground, adjustable bias means to supply direct current through said diodes to control the resistance thereof;

and termination impedance means coupled between said first and second other ports and ground, comprising a plurality of impedance elements, including an adjustable resistor coupled to said first other port, and an adjustable capacitor in parallel with a fixed resistor coupled to said second other port, to match the characteristic impedance of the hybrid when the diodes are unbiased.

2. An attenuator according to claim 1, wherein said quadrature hybrid means comprises a single quadrature hybrid having said four ports.

3. An attenuator according to claim 2, wherein said biase means is connected with one pole coupled to the junction of said first and third diodes and the other pole to the junction of said second and fourth diodes, with one of said junctions connected directly to ground, and the other of said junctions coupled via a capacitor to ground for radio frequency, and coupled to the bias source via an inductor, the diodes being directed so that the bias current flows in the forward direction through the first and second in series, and in the forward direction through the third and fourth in series; there further being two direct current blocking capacitors connected respectively between the diodes and said first and second other ports, the termination impedance means being connected directly to said first and second other ports.

* * * * *